United States Patent
Singh et al.

(10) Patent No.: US 6,334,965 B1
(45) Date of Patent: Jan. 1, 2002

(54) ELECTRONICALLY CONDUCTIVE POLYMERS

(75) Inventors: Waheguru Pal Singh; Dalibor Hodko, both of College Station, TX (US); Suchitra Chepin, San Deigo, CA (US); Oliver J. Murphy, Bryan, TX (US)

(73) Assignee: Lynntech, Inc., College Station, TX (US)

( * ) Notice: Subject to any disclaimer, the term of this patent is extended or adjusted under 35 U.S.C. 154(b) by 0 days.

(21) Appl. No.: 09/390,194

(22) Filed: Sep. 7, 1999

(51) Int. Cl.$^7$ .................................................. H01B 1/00
(52) U.S. Cl. .................. 252/500; 252/514; 252/519.33; 252/520.3; 524/155; 524/151
(58) Field of Search ................................ 252/514, 500, 252/519.33, 520.3; 524/155, 157

(56) References Cited

U.S. PATENT DOCUMENTS

| | | | |
|---|---|---|---|
| 4,406,826 A | 9/1983 | Morgan | 252/512 |
| 4,526,807 A | 7/1985 | Auerbach | 427/53.1 |
| 4,619,741 A | 10/1986 | Minten | 204/15 |
| 4,683,036 A | 7/1987 | Morrissey | 204/15 |
| 4,747,968 A | 5/1988 | Gilleo | 252/514 |
| 4,756,848 A | 7/1988 | Tieke | 252/511 |
| 4,810,333 A | 3/1989 | Gulla | 204/15 |
| 4,963,291 A | 10/1990 | Bercaw | 252/512 |
| 5,028,481 A | 7/1991 | Stramel | 428/323 |
| 5,071,517 A | 12/1991 | Oabayashi | 205/15 |
| 5,120,472 A | 6/1992 | Shikatani | 252/500 |
| 5,120,807 A * | 6/1992 | Wei et al. | 526/204 |
| 5,155,777 A | 10/1992 | Angelopoulos | 385/14 |
| 5,160,457 A | 11/1992 | Eisenbaumer | 252/500 |
| 5,180,523 A | 1/1993 | Durand | 252/512 |
| 5,198,153 A | 3/1993 | Angelopoulous | 252/500 |
| 5,200,112 A | 4/1993 | Angelopoulous | 252/500 |
| 5,202,061 A | 4/1993 | Angelopoulous | 252/500 |
| 5,244,562 A | 9/1993 | Russell | 204/418 |
| 5,246,627 A | 9/1993 | Heeger | 252/500 |
| 5,282,955 A | 2/1994 | Leventis | 204/317 |
| 5,300,208 A | 4/1994 | Angelopoulos | 205/50 |
| 5,310,625 A | 5/1994 | Angelopoulos | 430/325 |
| 5,370,825 A | 12/1994 | Angelopoulos | 252/500 |

(List continued on next page.)

FOREIGN PATENT DOCUMENTS

| | | |
|---|---|---|
| DE | P33 38 904.7 | 5/1985 |
| EP | 0 295 676 A2 | 6/1988 |
| EP | 0 495 549 A2 | 1/1992 |
| JP | 5-249605 | 9/1983 |

OTHER PUBLICATIONS

John E. Bone, A Completely New PCB Manufacturing Process, Sep. 1988, Electronic Manufacturing p. 4.

Gary Chamberlain, Conducting Polymers Open New Worlds—New materials make possible a whole range of exotic products, Jan. 21, 1991, Design News pp. 60–65.

James P. Langan, Direct Metallization, Circuit Technology 1985, Plating and Surface Finishing p. 34.

(List continued on next page.)

*Primary Examiner*—Yogendra Gupta
*Assistant Examiner*—Derrick G. Hamlin
(74) *Attorney, Agent, or Firm*—Streets & Steele; Jeffrey L. Streets

(57) ABSTRACT

The present invention provides a formulation for forming an electronically conducting polymer. The formulation contains an electron acceptor comprising a dopant anion and a metal cation selected from $Ag^+$, $Fe^{3+}$, $Cu^{2+}$ or combinations thereof. The preferred electron acceptor is a silver salt, preferably selected from $AgNO_3$, $AgClO_4$ and $AgNO_2$. The formulation also contains between 2 and 100 moles of a polymerizable component per mole of the electron acceptor, the polymerizable component being selected from pyrrole, aniline, their oligomers, or combinations thereof. In addition, the formulation includes an aqueous solvent selected from acetonitrile, acetone, and combinations thereof, the aqueous solvent having up to 30 volume percent water.

10 Claims, 1 Drawing Sheet

U.S. PATENT DOCUMENTS

| | | | |
|---|---|---|---|
| 5,378,404 A | | 1/1995 | Han .......................... 252/500 |
| 5,382,637 A | | 1/1995 | Angelopoulos ............. 525/436 |
| 5,462,696 A | | 10/1995 | McGinniss .................. 252/500 |
| 5,520,852 A | | 5/1996 | Ikkala ........................ 252/521 |
| 5,545,308 A | | 8/1996 | Murphy ...................... 205/125 |
| 5,859,085 A | * | 1/1999 | Hodko et al. ................. 522/74 |
| 5,871,672 A | * | 2/1999 | Muphy et al. ............. 252/514 |
| 5,919,402 A | * | 7/1999 | Murphy et al. ............. 252/514 |

OTHER PUBLICATIONS

James P. Langan, The Need for a More Free—flowing Process, Circuit Technology, Plating and Surface finishing p. 40.

James P. Langan, Solderability Requirements For Hight–density PWBs, Circuit Technoloty, Plating and Surface Finishing p. 34.

James P. Langan, Making Waste Minimization & Manufacturing Efficiency Work Together, Plating and Surface Finishing p. 34.

James P. Langan, Processing PWBs in a Clean Room Environment, Plating and Surface Finishing p. 50.

James P. Langan, PC Fabrication's Restructuring, Plating and Surface Finishing p. 114.

James P. Langan, Impact Of Advancing Technology On Printed Circuits, Feb. 1994, Circuit Technology p. 33.

James P. Langan, The Global Market, Circuit Technology, Jan. 1994 p. 43.

Brian Patterson, New Math, p. 10–11.

Shimshon Gottesfeld, A New Approach to the Metallization of Plastics, Abstract No. 243 p. 354.

Michael Carano, Novel Approach to the Metallization of Plated Through Hole Printed Wiring Boards, 1995, Electrochemicals, Inc. Abstract 6 pages, p. 179–184.

Marie Angelopoulos, Polyanilines: In Situ Radiation and Thermal Induced Doping 1991, mat. Res. Soc. Symp. Prod. vol. 214 pp. 137–142.

M. Angelopoulos, Polyaniline: Solutions, Films and Oxidation State, 1988, Mol. Cryst, Liq. Cryst. vol. 160 pp. 151–163.

Marie Angelopoulos, Water Soluble conducting Polyanilines: Applications in Lithography, Aug. 10, 1993, American Vacuum Society pp. 2794–2797.

Marie Angelopoulos, Conducting Polyanilines: Discharge layers for electron–beam lithography, 1989, American Vacuum Society pp. 1519–1523.

Marie Angelopoulos, Lithographic applications of conductin polymers, Jun. 15, 1991, American Vacuum Society pp. 3428–3431.

Shimshon Gottesfeld, The Application of a Polypyrrole Precoat for the Metallization of Printed Circuit Boards, Jan. 1992, The Electrochemical Society, pp. L14–L15.

Michael Carno, Plated Through–hole Processing: An Integrated Approach, Aug. 1994, Plating and Surface Finishing pp. 23–28.

H. Meyer, Use of conducting polymers and colloids, pp. 1326–1338.

W.S. Huang, Metallization of Printed Circuit Boards Using conducting Polyaniline, 1990, Mo. Cryst. Liq. Cryst. 1990, vol. 189, pp. 227–235.

D.M. de Leeuw, Electroplating of conductive polymers for the metallization of insulators, May 21, 1994, Synthetic Metals 66 pp. 263–273.

Francisco A. Uribe, Application of Conducting Polymer Precoats for the Metallization of insulators, 1993, Synthetic Metals, 55–57 pp. 3760–3765.

W. Metzger, New process for direct through–plating of printed circuit boards, Plating and Surface Finishing p. 28–32.

Terry Costlow, Conductive polymer inks may spell the future of multilayered boards, 1985, News Analysis, Technology News, Electronic Design. Feb. 7, 1985 pp. 53–55.

Gulla M., Electroplating non–conductors, 1995, Derwent Info Ltd.

Hiroshi Yoneyama, Photocatalytic Deposition of Light–Localized Polypyrrole Film Pattern on n–TYPE Silicon Wafers, 1986, Chemistry Letters pp. 657–660.

Young–seo Park, Simultaneous Formation of a Polypyrrole Film and a Tantalum Oxide Layer by Electrochemical Oxidation, Dec. 3, 1991, The Chemical society of Japan 1992 vol. 65, No. 7 pp. 1860–1865.

Schellekens, Ronald, Method for the preparation of a polymer composition containing an electrically conductive polymer, PCT International Publication No. WO 94/02886, Feb. 3, 1994.

* cited by examiner

ELECTRONICALLY CONDUCTIVE POLYMERS

This invention was made was made with government support under grant DMI-976331 awarded by the National Science Foundation. The government has certain rights in this invention.

It is to be noted that the U.S. government may have rights in the subject matter disclosed and claimed herein.

FIELD OF THE INVENTION

The present invention relates to electronically conductive polymers, as well as formulations and methods for preparing electronically conductive polymers. More particularly, the present invention relates to electronically conductive polymers having enhanced electrical conductivity.

BACKGROUND

The trend toward miniaturization, integration and automated assembly in the electronics industry is forcing designers to continually increase the component density in integrated circuit manufacturing, interconnection and packaging. Current demand for increasingly complex printed wiring boards (PWBs) has resulted in increasingly stringent requirements for all steps in their production. To produce high-quality boards at competitive prices requires that production costs be kept down. Lower production costs can be achieved by using and producing lower quantities of environmentally toxic chemicals, reducing the number of manufacturing steps, shortening process times, and increasing the degree of automation.

The introduction of double-sided boards, followed by multilayer boards, was made possible by metallizing plated through-holes with electroless copper. For the last 25 years, 98 percent of the PWBs manufactured have used this technology. However, electroless deposition of copper requires a potent reducing agent, such as formaldehyde, which is a reported carcinogen. Most electroless copper solutions also contain cyanide and chelating agents, which are difficult to remove from waste streams. Besides the normal drag-out associated with wet processing, "bail-out" (required to maintain solution balance and periodic bath changes) renders waste treatment of electroless copper far more expensive than electroplated copper. Another environmental and waste treatment concern associated with electroless copper is that it requires stripping copper from racks and tanks with nitric acid.

Electroless copper deposition typically involves a seven-step process with interval rinses with water that become contaminated with copper sulfate/EDTA/formaldehyde bath components. During electroless copper deposition or metallization, copper metal is deposited over the entire board surface and sensitized walls of through-holes, usually to a thickness of 0.001 in. Environmental concerns associated with electroless copper metallization, have fostered interest in direct metallization processes. Despite numerous attempts over the last 10 years, conversion to direct metallization processes has not gained widespread acceptance, and only about five percent of PWB manufacturers worldwide have eliminated metallization by electroless copper.

In addition, electronics manufacturers have not realized or appreciated the benefits that direct metallization can provide. These include reduced waste treatment/processing costs, lower chemical costs, improved efficiency/reliability, and the elimination of a time-consuming procedure.

Electronically conducting polymers have often been categorized as non-processable and intractable, because of their insolubility in the conducting form. Only recently has it been shown that polymers such as polyaniline can be dissolved using functionalized sulfonic acids. For polypyrrole, this can be achieved by using its derivatives [e.g., poly (3-octylpyrrole)] which are known to be soluble in different solvents, or by treatment in dilute aqueous sodium hypochlorite solutions, ammonia or mono-, di- or tri-substituted amine (co)solvents. Another method of solubilizing polypyrrole is the process of polypyrrole chain deprotonation in basic solutions, which causes a transformation of conducting polypyrrole into a non-conducting polymer of quinoid structure.

The lack of processability of conducting polymer materials, e.g., solution or melt processing, infusability and poor mechanical properties, e.g., ductility, have slowed down their emerging commercial applications. While electrochemical preparation of conducting polymers has been shown to be the most satisfactory process from the viewpoint of fundamental investigations, it is likely to be inappropriate for the large-scale industrial production of bulk quantities of these materials. This is particularly true where large molecular entities, e.g., copolymers or different additives, need to be incorporated into conducting polymer matrices in order to obtain tailored performance characteristics of the resulting polymer.

In order to compete with more-advanced interconnect systems, such as hybrid circuits and multichip modules (MCMs), future PWBs will have to be designed so that their size and cost advantages can be used to find a wider range of applications. This will require PWBs with increased conductor density. Increasing the conductor density requires finer lines and spaces (<5 mils), smaller vias (<12 mils), thinner multilayer boards (<0.032 in), and improved insulation resistance will be necessary. Finer lines and pitch will require high-resolution imaging and precision etching. The presence of plated-through-holes (PTHs 0.062–0.04 in) and vias (<0.10 in) in ever-increasing numbers, will present a challenge in laminating, drilling and metallization. Finally, the achievement of these objectives will requires improved electronically conductive polymers, as well as formulations and method for preparing electronically conductive polymers.

Consequently, there remains a need for improved electronically conducting polymers having sufficiently high conductivity to support a practical direct metallization process for preparing electronic circuits. It would be desirable to have improved formulations and methods for preparing electronically conducting polymers that are environmentally friendly, provide improved line definitions, avoid polymer solubility problems, can easily incorporate additives, does not depend upon electroless-copper plating, minimizes hazardous chemicals and copper plating solutions, requires fewer process steps, provides simplified through-hole metallization, and facilitates increased conductor densities.

SUMMARY OF THE INVENTION

The present invention provides a formulation for forming an electronically conducting polymer. The formulation contains an electron acceptor comprising a dopant anion and a metal cation selected from $Ag^+$, $Fe^{3+}$, $Cu^{2+}$ or combinations thereof. The preferred electron acceptor is a silver salt, preferably selected from $AGNO_3$, $AgClO_4$ and $AgNO_2$. The formulation also contains between 2 and 100 moles of a polymerizable component per mole of the electron acceptor, the polymerizable component being selected from pyrrole, aniline, their oligomers, or combinations thereof The polymerizable component preferably comprises pyrrole and aniline, more preferably the polymerizable component consists essentially of pyrrole and between about 14 and about 18 mole percent aniline. In addition, the formulation includes an aqueous solvent selected from acetonitrile, acetone, and combinations thereof, the aqueous solvent having up to 30 volume percent water. Preferably, the aqueous solvent has between about 1 and about 5 volume percent water.

DETAILED DESCRIPTION OF THE PREFERRED EMBODIMENT

Figure 1:
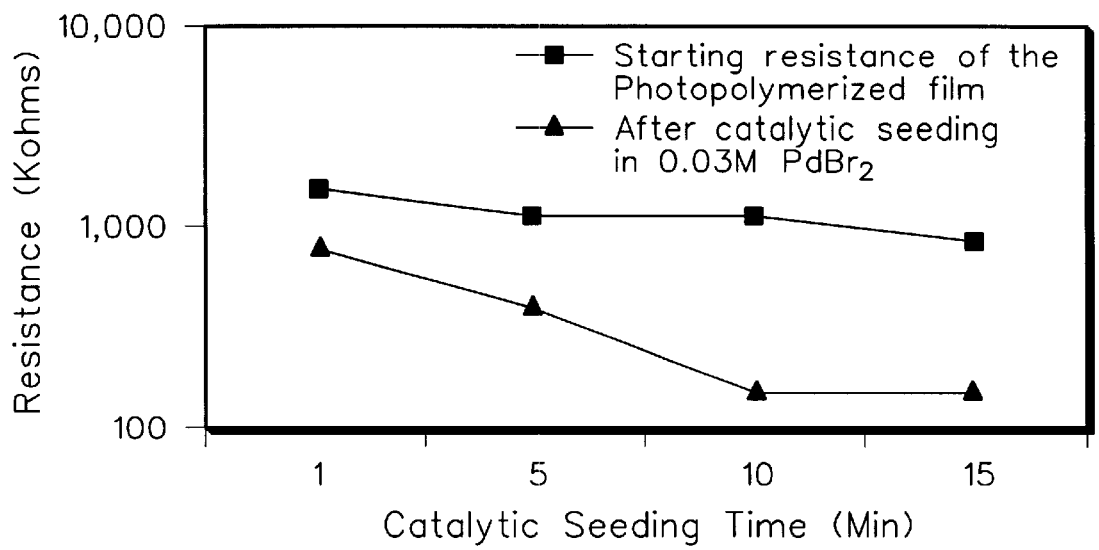
FIG. 1 is a graph showing the resistance of a photopolymerized polymer over time with and without palladium seeding.

The present invention provides a novel formulation and method for preparing conducting polymers which are suitable for use in direct metallization processes. The method can be used on nonconducting surfaces and is capable of metallizing both PWB conductor lines and through-holes. The method is highly compatible with lithographic processes used in manufacturing PWBs. The formulation and method both provide for environmentally sound manufacturing and high-resolution conductor line imaging.

The formulations of the present invention include (i) a polymerizable component such as a monomer or oligomer of pyrrole, aniline, or combinations thereof; (ii) an electron acceptor/dopant anion, and (iii) an aqueous solvent. Preferably, the electron acceptor/dopant anion is a salt that serves both as an electron acceptor for oxidation of the monomer(s) and as a dopant to preserve electroneutrality in the oxidized polymer. Preferred electron acceptors undergo very slow oxidation of the monomer in the dark (1–2 days) and provide the highest conductivities.

Molar ratios of monomer to electron acceptor ranging between about 2 and about 100 are effective for producing electronically conductive polymer films. However, the electrical conductivity of the polymers decreases with decreasing concentration of electron acceptor (increasing monomer to electron acceptor ratio).

The aqueous solvent contains up to 30 percent water, preferably between 1 and 5 percent water, and most preferably about 2 percent water. The water in the formulation is preferably provided as part of an aqueous solvent. The solvents themselves may include acetonitrile, acetone, methanol, tetrahydrofuran, or any other solvent that is miscible in water. It should be noted that the word "aqueous solvent" as used in this application means that the solvent contains some amount of water, and a "2 percent aqueous solvent" means that the solvent contains 2 volume percent water in the solvent.

Polypyrrole (PPY) can be chemically prepared using inorganic ($Fe^{3+}$ and $Cu^{2+}$ ions) or organic (chloranil) electron acceptors. When these inorganic acceptors are added to pyrrole-containing solutions a powdery polymer material results almost immediately after the addition. Therefore, cations having too high an oxidation potential are not suitable for photopolymerization of polypyrrole. Several attempts were made to use organic electron acceptors, but photopolymerization of black conductive PPY films was unsuccessful. It has been shown that electron acceptors with proper oxidation potential (e.g. $Ag^+$, $Fe^{3+}$ or $Cu^{2+}$ ions) and dopant (e.g. $NO_3^-$, $BF_4^-$, tosylate, etc.) play a decisive role in determining the conductivity of the conducting polymer film. The preferred electron acceptors are the silver salts (such as $AgNO_3$, $AgClO_4$ and $AgNO_2$), with the most preferred being silver nitrate, $AgNO_3$.

A polymer network can be formed by promoting the polymerization of a monomer, oligomer, or mixtures of monomers and/or oligomers. Polymerization is a chain reaction that can develop very rapidly, especially during photopolymerization when intense UV radiation is used to produce the initiating species. This UV-curing reaction leads ultimately to a three-dimensional polymer network. Since most of the monomers or oligomers commonly employed do not produce initiating species with a sufficiently high yield upon UV exposure, it is preferable for photopolymerization formulations to include a photoinitiator that will allow the photopolymerization to start. A typical UV-curable formulation, therefore, will contain two basic components: (i) a photoinitiator, and (ii) a monomer, oligomer, or a mixture of monomers and/or oligomers.

The choice of the photoinitiator is of prime importance in light-induced polymerizations, since it directly governs the cure rate. A suitable photoinitiator system must possess high absorption in the emission range of the light source. The photoinitiator must also form an excited state having a short lifetime to avoid quenching by oxygen or the monomer and split into reactive radicals or ionic species with the highest possible quantum yield. Other factors to be considered in selecting the proper photoinitiator include solubility in the monomer, storage stability and the nature of the photoproducts, which should not be colored, toxic or induce some degradation of the polymer upon aging. Photoinitiators can be classified into three major categories, depending on the kind of mechanism involved in their photolysis: (i) radical formation by photo-cleavage; (ii) radical generation by hydrogen abstraction, and (iii) cationic photoinitiators.

Cationic photoinitiators have proven to be particularly useful in the photopolymerization of polypyrrole from pyrrole monomers in solution. Besides their specificity, cationic-initiated photopolymerizations have the advantage of being insensitive to atmospheric oxygen. In the absence of nucleophilic reagents, the chain reaction will thus continue to develop after the illumination has ceased and provide a beneficial post-cure effect that can be enhanced by thermal treatment. The preferred post-photopolymerization thermal treatment involves heating the polymer at temperatures between about 80 and about 120 degrees Celsius for about three hours, with the most preferred temperature being about 100 degrees Celsius.

Thermally stable photoinitiators for cationic polymerizations of commercial significance include the onium salts, such as triarylsulfonium and diaryliodoniun, with complex metal halide anions. A key feature of these photoinitiators is the low nucleophilicity of the anions which reduces termination processes and allows ambient temperature cationic polymerization to proceed. The absence of air inhibition represents a distinguishing feature of cationic, as compared to radical, polymerization.

The photoinitiators investigated included a titanocene radical photoinitiator (such as IRGACURETM 784 available from Ciba Geigy, located in Ardsley, N.Y.), a cationic ferrocinium photoinitiator (IRGACURE 261 available from Ciba Geigy, located in Ardsley, N.Y.), triaryl sulphonium $PF_6^-$ salts (such as CYRACURE 6990, available from Union Carbide, located in Danbury, Conn.), triaryl sulphonium $SbF_6^-$ salts (such as CYRACURE™ 6974, available from Union Carbide, located in Danbury, Conn.). The photoinitiators are preferably added to the monomer in amounts less than about 8 weight percent, with the most preferred amounts being between about 0.2 to about 0.8 weight percent.

Photopolymerization of pyrrole alone, or pyrrole mixed with a photoinitiator such as titanocene, yields a transparent yellow film exhibiting insulating properties. Resistances of over 20 MΩ are measured by an ohmeter. When $AgNO_3$, an electron acceptor, is dissolved into the pyrrole prior to curing, a black polymer film characteristic of conducting polypyrrole is formed.

In general, thermally polymerized, electropolymerized and photopolymerized polypyrrole films all suffer from poor mechanical properties. They lack flexibility, either as stand alone films or as coatings. Three approaches have been found to improve the mechanical properties of photopolymerized polypyrrole: (i) incorporating large amphiphilic (surfactant) organic anions into the polypyrrole structure, (ii) photo-copolymerizing a suitable comonomer material with pyrrole, and/or (iii) including commercial flexibilizers. The preferred surfactants are large anionic surfactants, such as the sodium salts of dodecyl sulfate (DDS) and dodecylbenzene sulfonate (DDBS). The preferred comonomer is aniline. The preferred flexibilizer is polyethylene glycol diglycidyl ether.

In accordance with a preferred embodiment of the present invention, the formulations can include two or more monomer or oligomer species dissolved in an aqueous solvent which can be photopolymerized to form copolymers. While photo-copolymerizations can be achieved with many monomer pairings, the preferred monomer pairs for the lithographic production of an electronically conducting copolymer on a substrate are comprised of pyrrole in combination with a sub-stoichiometric amount of silver nitrate (preferably a molar ratio of pyrrole to silver nitrate of 8:1) and between ten and twenty mole percent aniline relative to pyrrole. The aniline is preferably between twelve and twenty mole percent, most preferably between fifteen and eighteen mole percent. The mixed monomer formulation is then diluted with an equivalent volume of aqueous acetonitrile to provide good contact with the substrate.

The addition of aqueous acetonitrile provides decreased resistance and increased conductivity to the polymerized formulation. The increased conductivity allows for the direct electroplating of copper or the subsequent metal of choice, thus eliminating the initial electroless plating step. The water concentration in the solvent can be up to 30%, preferably, from 1 to 5%, and most preferably about 2%.

The components of photopolymerizable solutions are preferably mixed in the dark, such as in a glass vial that excludes the penetration of light. The solutions are then sonicated to help dissolution and homogenization of the formulation. Since a slow chemical polymerization of pyrrole will typically take place over a period of about one to two days in the presence of Ag+ ions, it is preferred that fresh photopolymerizable formulations be prepared just prior to polymerization. A thin layer of the formulation is then cast and evenly spread on the surface of a selected substrate. The preferred methods of spreading the formulation over the substrate to achieve a thin layer having uniform thickness include brush coating, spraying, dipping and spin coating, with the most preferred method being spin coating.

After casting of the polypyrrole solution onto a substrate and formation of an air-dried nonconducting film, the oxidation process is initiated by irradiation. Optionally, the oxidation process may be initiated by thermal polymerization. The preferred polymerization methods are those which selectively expose only discrete regions or lines on the coated substrate, such as exposure by ultraviolet light through a contact mask, direct laser imaging, or electron beam imaging. Using these methods, thin polymer patterns (lines and through-holes) are readily polymerized on various conducting and nonconducting substrates. Multiple coating-curing cycles (up to 10 layers) can be carried out in order to produce thick uniform films.

Photopolymerizations according to the present invention can be accomplished with a 200-watt mercury-xenon lamp focused through a lens vertically downward onto a circular area of less than one centimeter diameter. All the optical accessories are preferably made of fused silica in order to pass high energy UV as well as visible light.

The present invention uses irradiation as the driving force to induce electron transfer from the monomer species in a cast solution film to the electron acceptor, also present in the formulation. As the concentration of oxidized polymer increases, coupling between the oxidized monomer units begins. This process continues, resulting in growth of the conducting polymer chains. Since the polymer is oxidized, the anion present in the formulation intercalates into the polymer to maintain electroneutrality.

The photopolymerization process does not require a conducting substrate for deposition to take place, and conducting polymer films and/or lines of various thickness, can be readily photopolymerized on typical PWB substrates (fiberglass/epoxy, polyimide) and MCM (alumina) as well as on metals, ceramic, silicon, GaAs, glass, paper, Teflon, Mylar and polystyrene substrates. The thickness of the films can be modified as desired, typically ranging from 0.5 microns up to 300 microns. The process of the present invention is much simpler than techniques known in the art and offers a high potential and flexibility for adaptation to a variety of PWB technologies.

The photopolymerization process of the invention includes the following steps:
(i) a photopolymerizable formulation is applied on a substrate;
(ii) after air-drying, a dry negative prepolymer film is exposed to laser light, an electron beam or to a UV lamp through a shadow mask;
(iii) the illumination induces photopolymerization of the prepolymer film at exposed areas rendering the exposed areas insoluble; and
(iv) the non-polymerized (non-illuminated) areas are washed off with water or an environmentally benign solvent such as acetone, leaving a pattern of conducting polymer lines.

A primary advantage of the photopolymerization process, compared to electrochemical and/or chemical polymerizations, is that it allows properties of the conducting polymer films to be easily designed and optimized by incorporating molecular species into the polymer structure. For example, it is possible to change the conductivity of the polymer by controlling the amount of the electron acceptor and dopant anions present in the formulations. The same oxidatively coupled cationic polymer is formed through photopolymerization as through electrochemical polymerization, except that the anion/monomer ratio is much higher (1:1.3) compared to that found in electrochemically formed films (1:4). This is a desirable feature because with more anions in the polymer matrix, more charge can be introduced onto the polymer chains and, consequently, higher conductivities may be achieved.

EXAMPLES

Photopolymerizable formulations for the examples discussed herein were prepared as follows:

(i) The electron acceptor/dopant, $AgNO_3$, (Aldrich Chemical Co.) was dissolved in acetonitrile (Aldrich) solvent and mixed in a dark vial with a pure monomer at molar ratios in the range pyrrole/$AgNO_3$=8:1 to 4:1. Silver tosylate (2.7 mol % with respect to pyrrole, both from Aldrich) was tested as an alternative electron acceptor/dopant. The solvent to pyrrole volume ratio was 1:1. Effect of the presence of water in the formulation on the conductivity of prepared films was measured by varying the water content in the range of greater than 0 and less than 30 vol % with respect to acetonitrile.

(ii) Aniline monomer (Aldrich) was added to the formulation in the range 16–18 mol % with respect to pyrrole.

Commercial printed wiring board material, FR-4 (mat finish), 30 mil thickness (Beaver Brook Company) was used unless otherwise indicated. The board material was typically cut into 2"×2" squares and used as a substrate for testing a direct metallization process by applying a photopolymerizable solution.

The photopolymerization process consisted of the following steps:

(i) The prepared photopolymerizable formulation (ca 0.3–0.5 ml) was spread on the 2"×2" FR-4 PWB substrate mounted on a spin coater (Specialty Coating Systems, Inc, Model PS 204-A).

(ii) The photopolymerizable solution was spun using rotation speeds in the range 700–1,800 rpm to form a thin monomer film;

(iii) The monomer coating was air dried for between 3 and 5 minutes;

(iv) A photomask was positioned on top of the coated PWB substrate for photopatterning of the conducting polymer patterns. The photomask was patterned in a 10 mil thick stainless steel shim stock using a computer controlled laser. The ESI model 44 laser trimmer was used with a YAG laser to cut regions of the shim stock away and to form a shadow mask or photomask. The mask contained several slits of different widths (e.g. 0.97, 0.79, 0.53, 0.35 and 0.15 nmm), which allowed resolution of the patterned conducting polymer lines to be tested.

(v) The monomer coating was illuminated through the photomask using Lw flood exposure. An Oriel solar simulator, Model 87703 was used as the source of the LV light (1000 W Hg(Xe) lamp, Oriel, Model 6293, with irradiance ranging from 240 nm–600 nm).

The non-polymerized (non-illuminated) areas were washed off with water, leaving a pattern of conducting polymer lines. The conducting polymer lines and/or coated through-holes were subsequently plated by electrodeposition of copper or by electroless nickel deposition, as set out in the specific examples below.

Catalytic Seeding of Conducting Polymer Films in Pd-ion Solution

To improve the conductivity of the photopolymerized films and provide catalytic sites for copper electroplating, the films were dipped in paladium bromide solutions (0.01 to 0.03 molar $PdBr_2$) acidified with hydrochloric acid to pH of between 2 and 3. The Pd (II) bromide contained 40% Pd (obtained from Aesar Co.of Wardhill, Mass.). The photopolymerized patterns on the PWB substrates were dipped in the palladium solution (for between 1 and 15 minutes, but typically 10 minutes) with no agitation and were washed with water after completion of the dipping process.

Electroplating

Copper Electroplating: The copper electro-plating solution used in the examples consisted of: copper sulfate, 75 g/l (Aldrich Chemical Co.); sulfuric acid, 100 ml/l (98%, Aldrich); COPPER GRAHAM 2001 Additive, 5 ml/l; COPPER GRAHAM 2001 Leveller, 2.5 ml/l; COPPER GRAHAM 2001 Carrier, 2.5 mil/l (each obtained from LeoRonal, Inc. of Freeport, N.Y.).

Nickel Electroplating: A LECTRO-NIC 10–03S Nickel (Enthone-Omi) sulfamate based electroplating solution (nickel sulfamate 340 g/l, 75 g/l nickel, boric acid, 40 g/l) was used in the examples to electroplate nickel on copper plated patterns. The nickel deposits thus plated are ideally suited as an undercoat for precious or other nonprecious metal deposits used in printed circuits, connectors, and semiconductor devices.

Single Point Contact Electroplating: The photopolymerized conducting polymer lines/patterns on PWB substrates were connected using silver epoxy paste to create a common single point contact. This contact and the polymer lines formed the cathode in the electroplating solution (connected to negative pole of the power supply). A wide (2"×3") expanded copper strip was used as the anode.

A 24 V/ 3 A DC power supply was used to control electroplating at constant current, and two multimeters were used to register current and voltage during electroplating. The plating was conducted in a small beaker at room temperature. A current of 20 to 100 mA was applied depending on the size of the plating pattern. In most cases the electroplating of the lines was completed in a period between 5 and 10 minutes. The copper plated samples were then washed with water, air-dried and stored under atmospheric conditions.

Resistance Measurements

Resistance of the photopolymerized films and/or patterns was measured using a van der Pauw four probe method. Four probes with gold spring loaded contacts had a spacing between the probes of 3 mm. By keeping the spacing between the probes constant, the resistance was reproducibly measured on the photopolymerized films and could be easily compared between the films prepared from different starting formulations. In some cases very high resistance, in the range of mega-ohms (M$\Omega$) to giga-ohms (G$\Omega$), had to be measured. For these measurements a KEITHILEY electrometer, Model 617 (a trademark of Keithley Istuments, Inc., Cleveland, Ohio), was used which has adequate input impedance of up to 200 T$\Omega$ to perform such measurements. All the results presented in the following examples represent an average of at least 3 to 5 repeated resistance measurements on the same film.

Example 1

Two Pd-salts, palladium acetate and palladium acetoacetate, were added to the formulation given above. A 3% molar ratio with respect to pyrrole of each salt was added to the formulation. The conductivity of the polypyrrole films did not increase (resistance of prepared films ranged from 3.7–17 M$\Omega$). The resistance of the samples subsequently seeded with palladium unexpectedly increased to the low giga ohms range, thereby preventing any subsequent electroplating process. Resolution of the formed polypyrrole patterns decreased as well.

Example 2

The conductivity of the surface of photopolymerized polypyrrole lines was significantly improved when the photopolymerized patterns were dipped into a bath containing palladium chloride or bromide. A 0.03 M PdBr$_2$ solution was found to be more efficient than a 0.01 M PdBr$_2$ in improving the conductivity. FIG. 1 shows that a "treshold resistance" of approximately 150 kΩ was achieved when the contact time with the palladium solution was 10 min. A resistance of about 150 kΩ or less is desirable for successful electroplating of copper on the photopolymerized polypyrrole. A further increase in the contact time did not improve the conductivity of the films.

Example 3

Aniline was added to the photopolymerizable formulation in the range 14–18 wt % with respect to pyrrole. The line sharpness was improved over formulations containing no aniline and the uncured film could be removed by washing with water. In these formulations, a 2% aqueous solution of acetonitrile (2% water, 98% acetonitrile) was used as the solvent. After catalytic seeding of these prepared films, the resistance of the polypyrrole/polyaniline copolymer films decreased to 150 kΩ resulting in easily electroplated surfaces.

Example 4

The effect of water concentration in the acetonitrile solvent on the conductivity of the films was investigated. Table 1 shows that the presence of water in the formulation enhances film conductivity, particularly after catalytic seeding with the palladium-ion solution as carried out in Example 2. A slight increase in conductivity with increased amounts of water was obtained for photopolymerized films prepared, even prior to using the palladium seeding step.

The formulations containing water produced a polymer film that showed a resistance of between 150 and 200 kΩ after the palladium bromide step. Films prepared from non-distilled pyrrole after seeding in palladium solution also exhibited 149 kΩ.

TABLE 1

Effect of water concentration in acetonitrile solvent on the conductivity of photopolymerized polypyrrole/polyaniline films.

| Photopolymerizable Solution (pyrrole:silver nitrate 8:1; 16% aniline) | No Catalytic Seeding in PdBr$_2$ Resistance Range (Min–Max) | After Catalytic Seeding in PdBr$_2$ Resistance Range (Min–Max) |
| --- | --- | --- |
| Water % in acetonitrile | MΩ | kΩ |
| 0% | 2,060–5,400 | 520–4,000 |
| 1% | 0.76–83 | 175–179 |
|    | 0.52–53 | 179–181 |
| 2% | 1.7–1.9 | 159–166 |
|    | 1.2–1.9 |         |
| 10% | 0.83–74 | 161–179 |
|     | 0.82–74 |         |
| 20% | 0.64–74 | 164–172 |
|     | 0.64–74 |         |

The resistance of all the palladium seeded samples decreased dramatically to an approximately constant value, ranging from 159–181 kΩ, independent of the water concentration.

Example 5

Figure 2:
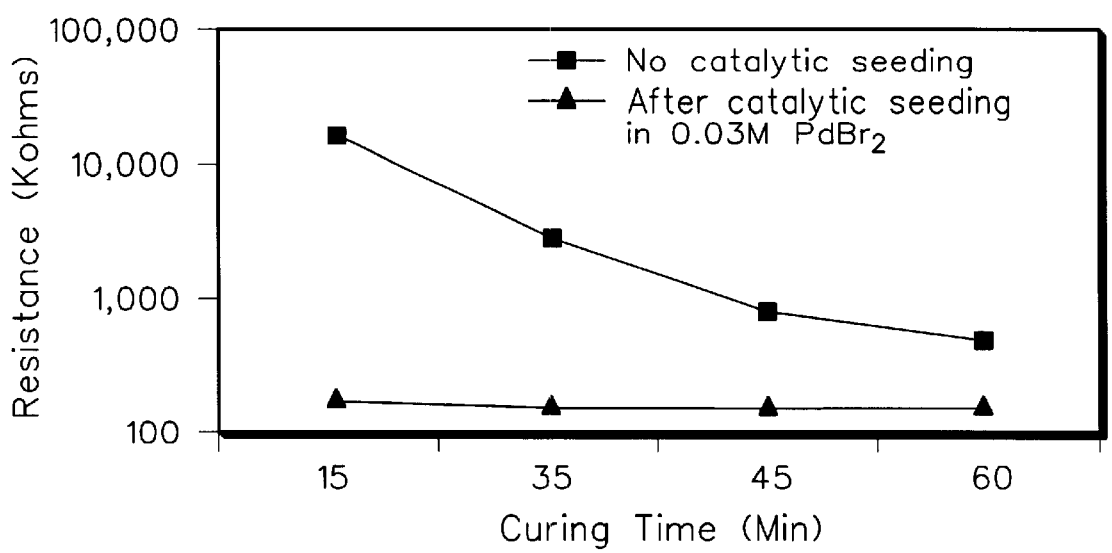
FIG. 2 is a graph showing the resistance of a photopolymerized polymer with and without palladium seeding as it relates to the curing time of the polymer.

The effect of curing time on the quality and conductivity of polymer lines was studied. Identical samples were prepared from the photopolymerizable solution containing 2% water with respect to acetonitrile. A commercially available UV system UV24 (a trademark of Colight of Union, N.J.) was used to polymerize the formulation. The results are presented in FIG. 2. It was found that the conductivity of the samples improved with curing time and reached a limiting value at 30 minutes.

Example 6

The resistances of polypyrrole films prepared without palladium seeding were spin coated at 600 rpm, 900 rpm, 1,200 rpm and 1,800 rpm and yielded resistance values of 0.198 MΩ., 0.23 MΩ, 1.58 MΩ and 200 MΩ, respectively. The corresponding resistances of the films after seeding in palladium were 150 kΩ, 149.2 kΩ, 150.9 kΩ and 100 MΩ. As expected, the conductivity of the polymer layer was inversely proportional to the spin coating rate. Samples coated at spin coating rates higher than 1,800 rpm were found to be essentially non-conducting. The preferred speeds for spin coating were determined to be between 600 and 1,200 RPM, with 900 RPM being most preferred.

Example 7

The palladium solution was analyzed for palladium by atomic absorption spectroscopy after successive dipping of a relatively large number of conducting polymer coated PWB samples. The samples, 2×2 cm$^2$, were prepared using the formulation discussed above and were cured under identical conditions.

The results showed that the conductivity of the palladium seeded polymer samples was unaffected even as the concentration of the palladium was slightly depleted in the catalytic seeding solution. It was estimated that the amount of palladium adsorbed per square cm of the photopolymerized surface was between 6.6 to 10.2 ppm/cm$^2$ (20 ml of palladium solution was used). This corresponds to approximately 0.132–0.204 mg palladium per cm$^2$ of the coated PWB substrate. This demonstrates that very small amount of Pd seeding step and that the proposed direct metallization process can be cost effective compared to processes that unilize higher concentration of colloidal palladium in the in the catalytic seeding step.

The stabilty of the films prepared from the formulation using 2% aqueous acetonitrile as the solvent was tesed by daily measurement of the film conductivity. Table 2 demonstrates that the thin photopolymerized polypyrrole/polyaniline film were very stable and showed no significant change in conductivity a period of one month.

TABLE 2

Effect of long term storage on the conductivity of photopolymerized polypyrrole films.

| Conditions | Sample | Resistance After Day 1 | Resistance After 33 Days |
| --- | --- | --- | --- |
| No Catalytic Seeding in PdBr$_2$ | 1 | 1.4–2.5 MΩ | 1.1–2.8 MΩ |
|  | 2 | 1.2–2.5 MΩ | 2.6–4.8 MΩ |
| Catalytic Seeding in 0.03 M PdBr$_2$ | 3 | 155–162 kΩ | 160 kΩ |
|  | 4 | 161.1–164 kΩ | 160.1 kΩ |
|  | 5 | 169–183 kΩ | 163 kΩ |
|  | 6 | 161–169 kΩ | 158 kΩ |

Example 8

Polymer films were from formulations having varying amounts of water, a pyrrole:silver nitrate ratio of 8:1, and a total monomer content of 16% aniline and 84% pyrrole. The formulation were put on 2 inch substrates, spin coated at 900 rpm, cured for 30 minutes, washed with water, seeded with Pd and electroplated by applying 80 mA of current for five minutes. All of these sample films, except the prepared from a formulation without water, were well plated. The results are presented in Table 3. The percentage of the polymer film pattern that was electroplate was obtained upon visual examination of the lines after copper deposition. This was possible because copper electroplating starts from the contact point and develops further along the polypyrrole lines. All the copper plated lines showed good conductivity with resistance values below 1 ohrm.

All of the electroplated samples were subjected to the standard ASTM D3359-95a adhesion tape test which utilizes PERMACEL 99 tape. The copper lines on all the samples were found to adhere very well to the substrate, however, the sample prepared with 5% aqueous acetonitrile solvent in the starting formulation demonstrated the best adhesion.

TABLE 3

Efficiency of electroplating and adhesion of polypyrrole lines as a function of water content in the starting photopolymerizable formulation.

| Photopolymerizable Formulation Water Content (%) | Approximate Area of Polymer Pattern Electroplated (%) | Adhesion (Scale 1–5) |
|---|---|---|
| No water | 40 | |
| 1 | 100 | 4A |
| 2 | 100 | 4A |
| 5 | 100 | 5A |
| 10 | 100 | 4A |
| 20 | 100 | 4A |

The photopolymerized polypyrrole lines before and after electroplating with copper where visually inspected. The smallest line width tested was 150 microns, which is within the range of the line resolution required for standard PWB. When a current as low as 20 mA was applied, 90% of the polymer lines were plated within ten minutes.

Example 9

Double-sided printed circuit designs where prepared to demonstrate through hole photopolymerization of conducting polypyrrole as well as electroplating of conductive vias. Holes having a diameter of between 1.0 and 1.5 mmn were drilled in the PWB substrates. The polypyrrole conducting pattern was photopolymerized on both sides of the board including the through hole coating. The formulation contained pyrrole:silver nitrate (8:1), aniline (16%) and 2% aqueous acetonitrile (1:1/2 volumetric ratio of the monomer solution to solvent) was applied on one side of the board followed by curing under standard conditions. The monomer solution was modified by using a 1:1/2 volumetric ratio of 2% aqueous acetonitrile instead of 1:1 ratio in order to increase the viscosity of the formulation and provide easier coating of the holes.

The film pattern formed on the backside of the board was photopolymerized in the same way. The cured sample was then dipped in a 0.03 molar palladium solution for 10 minutes and washed with water. Copper electroplating of the seeded polymer lines on both sides of the board and electroplating of the through-hole was performed at 80 mA for 5 minutes. The photopolymerized lines were successfully plated with copper on both sides of the board and on the through-hole walls.

Cross-sectional SEM photographs showed complete coverage of the through hole walls. The procedure was repeated on three samples with the same results. The continuity of the copper lines and through-hole plating was verified by resistance measurements, which showed less than one ohm resistance on contacting the edge of the lines on the two sides of the PWB substrate. This indicated successful through-hole copper electroplating.

Example 10

A process for direct metallization of PWBs using photopolymenized polypyrrole as a conductive layer for electroplating of copper through a photoresist photopatterned on the polymer surface was carried out. The process was performed by covering the entire surface of the PWB substrate with a conducting polymer film, photopatteming a photoresist on the surface of the conducting polymer, electroplating the exposed conducting polymer patterns and removing the photoresist and non-plated polypyrrole. Electroplating was performed at a constant current of 40 mA for 10 minutes. All the polypyrrole lines were plated quickly and uniformly.

Two processes for direct metallization of PWBs using an additive process for the photopolymerization and plating of conducting polymers were examined. The first process is based on electroplating the photopolymerized conducting polymer patterns/lines with a rolling cathode electroplating device. In this process only the photopatterned polymer lines are electroplated, thus avoiding the need for copper lamination, electroless copper plating and copper etching steps.

To maximize the conductivity, adhesion and appearance of thin polypyrrole/polyaniline films (less than 1 $\mu$m thickness), it was found that a preferred formulation includes (i) a molar ratio of pyrrole monomer/silver nitrate of 8:1;(ii) aniline concentration in the range between 14 and 16 mole % with respect to pyrrole; (iii) acetonitrile to pyrrole monomer volume ratio 1:1, and (iv) two (volume) percent water with respect to acetonitrile. The preferred illumination time, with a Xe(Hg) 1000 W lamp at between 15 and 20 cm distance from the sample, was in the range between 20 and 30 minutes. The preferred spin coating rate for covering a 2.5 cm×2.5 cm PWB substrate with photopolymerizable solution was 900 rpm. The addition of deep UV photoinitiators, such as IRGACURE 261 (a trademark of Ciba Specialty Chemicals, Tarrytown, N.Y.), did not significantly increase the rate of polymer photocuring. Photopolymerization of conducting polypyrrole was tested using a high intensity commercial UV illumination system at a commercial PWB manufacturing facility. The photocuring of polypyrrole was achieved within 30 seconds, thereby demonstrating that the new direct metallization process based on photopolymerization of conducting polymers could be performed using equipment already available in the PWB manufacturing industry.

It will be understood that certain combinations and subcombinations of the invention are of utility and may be employed without reference to other features in subcombinations. This is contemplated by and is within the scope of the present invention. Because many possible embodiments may be made of this invention without departing from the spirit and scope thereof, it is to be understood that all matters hereinabove set forth or shown in the accompanying drawings are to be interpreted as illustrative and not in a limiting sense.

What is claimed is:

1. A formulation for forming an electronically conducting polymer, the formulation comprising:

(a) an electron acceptor comprising a dopant anion and a metal cation selected from $Ag^+$, $Fe^+$, $Cu^{2+}$ or combinations thereof;

(b) between 2 and 100 moles of a polymerizable component per mole of the electron acceptor, the polymerizable component comprising pyrrole and aniline; and (c) a solvent selected from acetonitrile, acetone, and combinations thereof, the solvent having greater than 1 and up to 30 volume percent water.

2. The formulation of claim 1, wherein the solvent has greater than 1 and up to about 5 volume percent water.

3. The formulation of claim 1, wherein the electron acceptor is a silver salt.

4. The formulation of claim 3, wherein the silver salt is selected from $AgNO_3$, $AgClO_4$ and $AgNO_2$.

5. The formulation of claim 3, wherein the silver salt is $AgNO_3$.

6. The formulation of claim 1, wherein the polymerizable component consists essentially of pyrrole and between about 14 and about 18 mole percent aniline.

7. The formulation of claim 1, wherein the polymerizable component comprises pyrrole and between about 14 and about 18 mole percent aniline.

8. A polymer composition prepared by curing the formulation of claim 1.

9. The formulation of claim 1, wherein the solvent has between 2 and 30 volume percent water.

10. The formulation of claim 1, wherein the solvent has between 2 and 5 volume percent water.

\* \* \* \* \*